United States Patent
Ichikawa et al.

(10) Patent No.: US 9,482,721 B2
(45) Date of Patent: Nov. 1, 2016

(54) ELECTRIC POWER SOURCE CIRCUIT AND ABNORMALITY DIAGNOSIS SYSTEM

(71) Applicant: DENSO CORPORATION, Kariya, Aichi-pref. (JP)

(72) Inventors: Kazuhiro Ichikawa, Kariya (JP); Yutaka Oohashi, Handa (JP)

(73) Assignee: DENSO CORPORATION, Kariya (JP)

( * ) Notice: Subject to any disclaimer, the term of this patent is extended or adjusted under 35 U.S.C. 154(b) by 692 days.

(21) Appl. No.: 13/737,970

(22) Filed: Jan. 10, 2013

(65) Prior Publication Data
US 2013/0119782 A1    May 16, 2013

Related U.S. Application Data

(63) Continuation of application No. 12/574,855, filed on Oct. 7, 2009, now abandoned.

(30) Foreign Application Priority Data

Oct. 8, 2008 (JP) ................................. 2008-261333
Nov. 7, 2008 (JP) ................................. 2008-286696

(51) Int. Cl.
  G01R 31/327  (2006.01)
  H01H 47/00   (2006.01)
  G01R 31/40   (2014.01)

(52) U.S. Cl.
  CPC ......... *G01R 31/327* (2013.01); *G01R 31/3277* (2013.01); *G01R 31/40* (2013.01); *H01H 47/00* (2013.01); *Y10T 307/747* (2015.04)

(58) Field of Classification Search
  CPC ..... G01R 31/327; G01R 31/40; H01H 47/00
  USPC ......................................................... 324/686
  See application file for complete search history.

(56) References Cited

U.S. PATENT DOCUMENTS

| | | | |
|---|---|---|---|
| 5,608,375 A | | 3/1997 | Kosich |
| 5,870,693 A | * | 2/1999 | Seng ................. G06F 11/22 702/122 |
| 7,368,829 B2 | | 5/2008 | Tezuka |
| 2003/0216841 A1 | | 11/2003 | Hashimoto et al. |
| 2010/0085060 A1 | | 4/2010 | Ichikawa et al. |

FOREIGN PATENT DOCUMENTS

| | | |
|---|---|---|
| JP | 06-044352 | 6/1994 |
| JP | 11-245829 | 9/1999 |

(Continued)

*Primary Examiner* — Thomas Valone
(74) *Attorney, Agent, or Firm* — Nixon & Vanderhye P.C.

(57) ABSTRACT

A control unit for a rotary electric machine includes a first current command module, a second current command module, a change module, and a return module. The first module performs a first current command on a maximum efficiency characteristic line on a d-q plane thereby to drive the machine at a maximum efficiency. The second module performs a second current command on a switching line set at a retard angle side relative to the maximum efficiency characteristic line. The change module changes a control mode from a rectangular wave voltage phase control mode to an overmodulation current control mode when an operation point of the machine reaches the switching line. The return module returns the current command from the second command to the first command after performance of the second command for a predetermined period.

12 Claims, 8 Drawing Sheets

(56) References Cited

FOREIGN PATENT DOCUMENTS

| JP | 2000-145491 | 5/2000 |
| JP | 2002-044990 | 2/2002 |
| JP | 2002-240655 | 8/2002 |
| JP | 2004-135389 | 4/2004 |
| JP | 2007-244123 | 9/2007 |
| JP | 2007-276706 | 10/2007 |

* cited by examiner

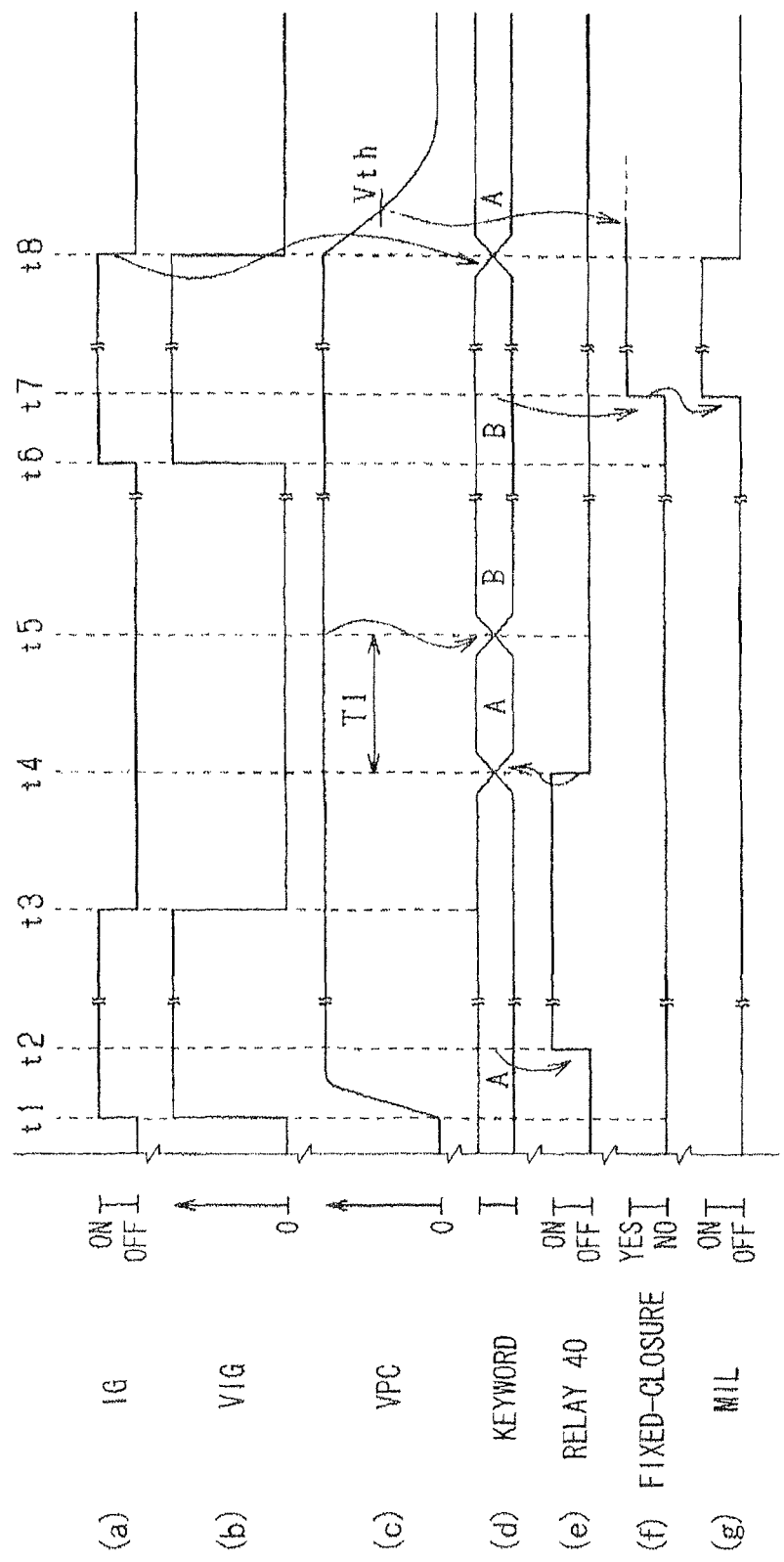

ELECTRIC POWER SOURCE CIRCUIT AND ABNORMALITY DIAGNOSIS SYSTEM

CROSS REFERENCE TO RELATED APPLICATION

This application is a Continuation of application Ser. No. 12/574,855, filed Oct. 7, 2009, which is based on and incorporates herein by reference Japanese Patent Applications No. 2008-261333 filed on Oct. 8, 2008 and No 2008-286696 filed on Nov. 7, 2008.

FIELD OF THE INVENTION

The present invention relates to an electric power source circuit and an abnormality diagnosis system for the electric power source circuit. The electric power source circuit includes an power supply relay for opening and closing an electric power conversion circuit and an power supply part, a capacitor connected between an electric current path, which is formed between the power conversion circuit and the power supply relay, and a reference potential source, a pre-charge path bypassing the power supply relay for pre-charging the capacitor, and an on/off switch for connecting and disconnecting the pre-charge path and the power supply part.

BACKGROUND OF THE INVENTION

In a conventional electric power source circuit, an power supply relay is provided in an electric current path between an electric power conversion circuit and a battery to turn on and off the electric current path. In a case that the length of the current path between the power conversion circuit and the battery is long, a capacitor is conventionally provided near the power conversion circuit so that the capacitor is pre-charged by the battery to stably supply the power conversion circuit with electric power.

If the power supply relay is used, it is desired to diagnose whether the power supply relay normally operates. The power supply relay is diagnosed with respect to its abnormality (malfunction) of fixed-closure, in which the power supply relay is persistently closed due to fixation of a movable contact. This fixed-closure can be determined by detecting a charge voltage of the capacitor in response to a trigger that is caused when an on/off switch part (ignition switch) for connecting and disconnecting the battery and a part operating the power conversion circuit is closed. At the time immediately after the ignition switch is turned on, the capacitor is supposed to have not been charged yet because the power supply relay has been turned off. If the capacitor has been charged, the power supply relay is diagnosed as being in the abnormal condition of fixed-closure.

Fusion abnormality is considered as one of the causes of the fixed-closure of the power supply relay. This abnormality arises, when a large electric current flows from the battery to the capacitor at the time of turning on the power supply relay to the closed state and melts the movable contact to a fixed contact during closure of the power supply relay. It is therefore desired to avoid the fusion abnormality. A power supply relay, which can supply a large electric current, may be used to avoid the fusion abnormality. This power supply relay however is large in size and costly.

JP 11-245829 proposes to connect a capacitor connected between an H-bridge circuit of an electric motor and a power supply relay to a battery through an on/off switch part (ignition switch) and a pre-charge resistor. When the ignition switch is turned on, the charge of the battery is supplied to charge the capacitor through the ignition switch and the resistor. As a result, even when the power supply relay is turned on subsequently, a large current is restricted from flowing from the battery to the capacitor through the power supply relay.

The fixed-closure of the power supply relay may arise for causes other than the large current, which flows to the capacitor. It is therefore also desired in the proposed power source circuit to diagnose whether the power supply relay is in the fixed-closure state. In the case of an arrangement, in which the capacitor is charged by turning on the ignition switch, the capacitor may not produce a large voltage difference, by which the fixed-closure of the power supply relay is detectable, between the capacitor voltages at the time of turning on the ignition switch. It is therefore difficult to diagnose the power supply relay with respect to the fixed-closure abnormality.

It is also possibly difficult to diagnose fixed-open abnormality, in which the power supply relay is persistently held in the fixed-open state, because the capacitor is charged by turning on the ignition switch.

SUMMARY OF THE INVENTION

It is therefore an object of the present invention to improve an electric power source circuit and an abnormality diagnosis system, so that an abnormality of an power supply relay may be diagnosed even in an arrangement that the power source circuit has a pre-charge path for pre-charging a capacitor connected between a current path of an electric power conversion circuit and the power supply relay and the ground.

According to the present invention, an abnormality diagnosis system is provided for a power source circuit, which includes an electric power source, a power supply relay, a capacitor, a pre-charge path and a switch. The power supply relay is provided to open and close a current path formed between the electric power source and a power conversion circuit. The capacitor is connected between a reference potential and the current path formed between the power conversion circuit and the power supply relay. The pre-charge path is formed between the power source and the capacitor to pre-charge the capacitor by the power source. The pre-charge path bypasses the power supply relay. The switch is provided to open and close the pre-charge path.

In one aspect, a diagnosis circuit is provided for diagnosing the power supply relay with respect to fixed-closure of the power supply relay based on a drop of a charge voltage of the capacitor produced after both the switch and the power supply relay are operated to open. The fixed-closure abnormality indicates that the power supply relay maintains a closed state even if operated to open.

In another aspect, a motor relay is provided between the power conversion circuit and a motor to open and close a current path from the power conversion circuit to the motor. A diagnosis circuit is provided to diagnose the power supply relay with respect to fixed-open abnormality based on a charge voltage of the capacitor produced when all of the switch, the power supply relay and the motor relay are operated to close, the fixed-open abnormality indicating that the power relay maintains an open state even if operated to close.

BRIEF DESCRIPTION OF THE DRAWINGS

The above and other objects, features and advantages of the present invention will become more apparent from the following detailed description made with reference to the accompanying drawings. In the drawings:

FIG. 3 is a time chart showing an example of the processing of diagnosing fixed-closure abnormality in the first embodiment;

DETAILED DESCRIPTION OF THE PREFERRED EMBODIMENT

First Embodiment

According to a first embodiment, an abnormality diagnosis system for an electric power source circuit of the present invention is applied to an abnormality diagnosis system for a power source circuit of an electric power steering apparatus mounted on a vehicle.

Figure 1:
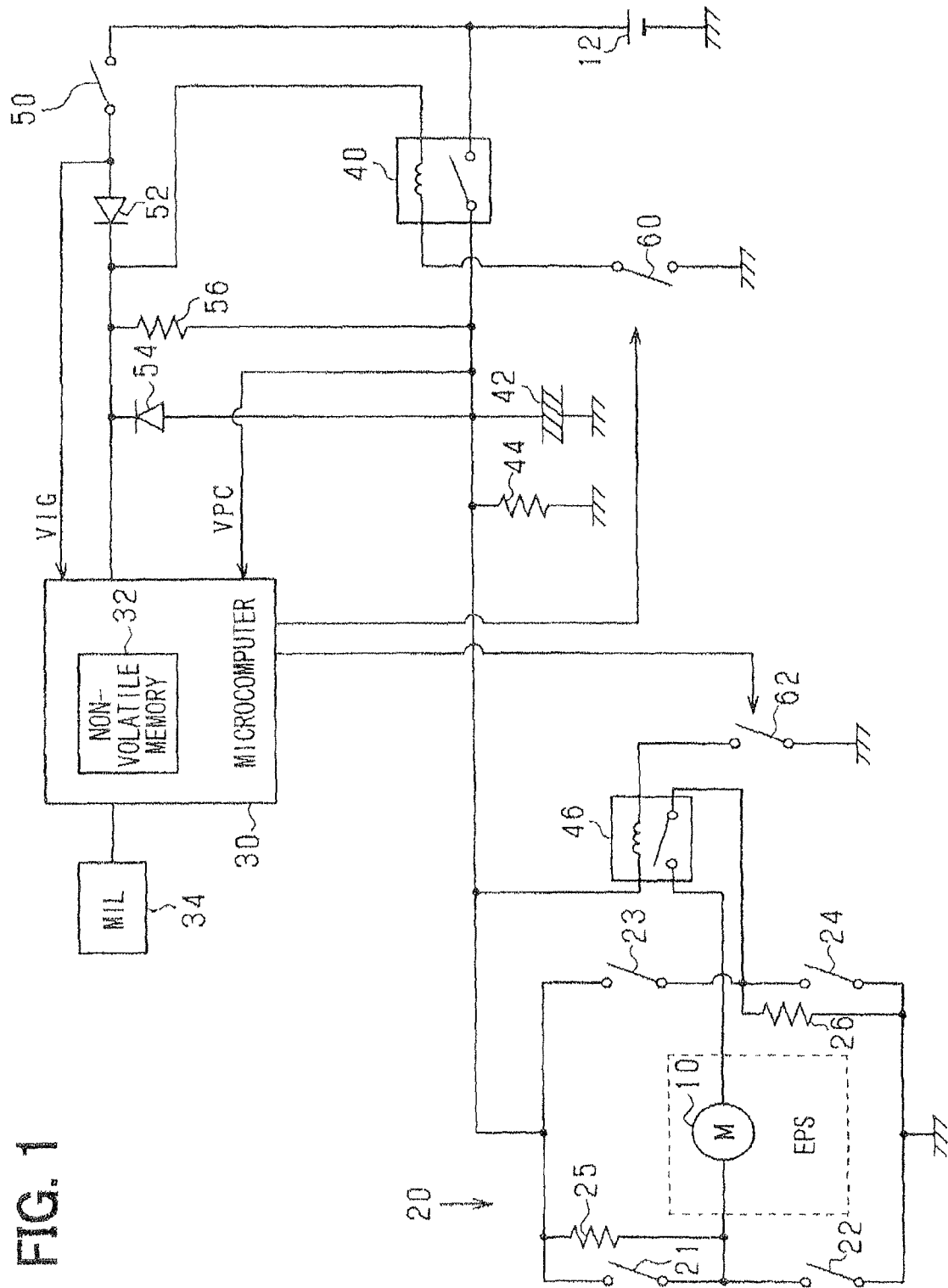
FIG. 1 is a circuit diagram showing an abnormality diagnosis system according to a first embodiment of the present invention.

Referring to FIG. 1, an electric motor 10 is a DC motor with brushes. The motor 10 is an actuator provided in a steering apparatus, which power-assists steering operation of a driver. The motor 10 is supplied with electric power of a battery 12 through a H-bridge circuit 20.

The H-bridge circuit 20 is an electric power conversion circuit for supplying the electric power of the battery 12 to the motor 10. Specifically, the H-bridge circuit 20 has parallel-connected series arms. In one series arm, switching elements 21 and 22 are connected in series. In the other series arm, switching elements 23 and 24 are connected in series. The switching elements 21 to 24 may be transistors. A pair of terminals of the motor 10 is connected to junctions of two switching elements of each arm, respectively. Resistors 25 and 26 are connected to the switching elements 21 and 24 for fail-safe operation, respectively.

A microcomputer 30 is provided to control a drive amount (torque, etc.) of the motor 10 as a subject of control by controlling the H-bridge circuit 20. The microcomputer 30 includes a CPU, a ROM, a RAM, etc. in the known manner. The microcomputer 30 further includes a non-volatile memory 32. The memory 32 may be an EEPROM, etc., which maintains its storage even when the power supply is interrupted.

As an electric power source circuit for supplying the electric power of the battery 12 to the motor 10 through the H-bridge circuit 20, a power supply relay 40 is connected to connect and disconnect the battery 12 and the H-bridge circuit 20, that is, to open and close a current path between the battery 12 and the H-bridge circuit 20. The power supply relay 40 is an analog normally-open type relay, which is an electromagnetic relay such as a movable core-type relay. The power supply relay 40 closes a current path when excited to turn on. The power source circuit further includes a capacitor 42 and a discharge resistor 44, which connects a current path between the power supply relay 40 and the H-bridge circuit 20 and the reference potential source (for example, ground). The capacitor 42 is connected at a position closest to the H-bridge circuit 20 so that the length of a wire (current path) between the capacitor 42 and the H-bridge circuit 20 may be shortened to a minimum. The capacitor 42 has a large capacitance so that the electric power is supplied to the H-bridge circuit 20 stably. The discharge resistor 44 is provided to discharge the capacitor 42.

The power source circuit further includes an electric motor relay (motor relay) 46, which connects and disconnects the terminals of the motor 10 and the H-bridge circuit 20. The motor relay 46 also may be an analog normally-open type relay, which is an electromagnetic relay such as a movable core-type relay. The motor relay 46 closes a current path when excited to turn on.

The power source circuit further includes an on/off activation switch (ignition switch 50) operable for activating a vehicle-mounted control system by a user, and a diode 52 for allowing supply of the electric power of the battery 12 to the microcomputer 30 through the ignition switch 50. A diode 54 is connected between a junction of the power supply relay 40 and the H-bridge circuit 20 and a junction of the cathode of the diode 52 and the microcomputer 30. The diode is forward-biased in a direction from the junction between the junction of the power supply relay 40 to the microcomputer 30. A resistor 56 is connected in parallel to the diode 54 between the junction of the power supply relay 40 and the H-bridge circuit 20 and the junction between the cathode of the diode 52 and the microcomputer 30.

The microcomputer 30 is activated when the electric power of the battery 12 is supplied through at least one of the diode 52 and the diode 54. The microcomputer 30 controls the drive amount of the motor 10. The microcomputer 30 drives the motor 10 in the forward rotation direction or in the reverse rotation direction by selectively turning on and off the switching elements 21 and 24 periodically or turning on and off the switching elements 22 and 23 periodically. The amount of current supplied to the motor 10 is controlled based on a duty ratio of an on-time of the switching elements relative to one cycle time (on-and-off time) of the same in the periodic on-off control.

The microcomputer 30 executes processing to turn on (close) the power supply relay 40 and the motor relay 46 in advance of controlling the drive amount of the motor 10.

One terminal of an excitation coil of the power relay 40 is connected to one terminal (cathode of the diode 52) of the ignition switch 50, which is not connected to the positive-side of the battery 12. The other terminal of the excitation coil is grounded through the switching element 60. When the microcomputer 30 turns on the switching element 60 under a condition that the ignition switch 50 is in the closed state, a current flows from the battery 12 to the ground through the excitation coil of the power supply relay 40 from the battery 12. The excitation coil of the power supply relay 40 responsively generates magnetic force thereby to move a movable contact of the power supply relay 40. As a result, an input terminal, which is connected to the battery 12, and an output terminal, which is connected the H-bridge circuit 20, are connected (turned on to closed state).

The motor relay 46 has an excitation coil, one terminal of which is connected to the capacitor 42 and the H-bridge circuit 20 and the other terminal of which is grounded through a switching element 62. When the microcomputer 30 turns on the switching element 62 to the closed state, a current flows to the ground from the battery 12 through the excitation coil of the motor relay 46. The excitation coil of the motor relay 46 responsively generates magnetic force thereby to move a movable contact of the motor relay 46. As a result, an input terminal, which is connected to the H-bridge circuit 20, and an output terminal, which is connected to the motor 10, are connected (turned on to closed state).

When the ignition switch 50 is turned on, the microcomputer turns on the switching element 60 to turn on the power supply relay 40 to the closed state, and then turns on the switching element 62 to turn on the motor relay 46 to the closed state. With the relays 40 and 46 being thus set to the closed state, the drive amount of the motor 10 is controlled by controlling the H-bridge circuit 20 so that the motor 10 assists the steering operation of a driver.

When the ignition switch 50 is turned on, the capacitor 42 is pre-charged by the current supplied from the battery 12 through the pre-charge resistor 56, before the power supply relay 40 is turned on to the closed state by the microcomputer 30. As a result, the capacitor 42 is charged to the charge voltage, which corresponds to the voltage of the battery 12, before a time point the power supply relay 40 is turned on to close. Specifically, the charge voltage of the capacitor 42 is a voltage VPC, which corresponds to a resistance division ratio R44/(R44+R56) of the voltage VIG of the battery 12 (specifically less a voltage V52 of the diode 52). The resistance R56 of the pre-charge resistor 56 is set to be far smaller than the resistance R44 of the discharge resistor 44. Therefore, at the time point the power supply relay 40 is turned on, the charging of the capacitor 42 to be close to the voltage of the battery 12 is completed readily. The current, which flows from the battery 12 to the capacitor 42 at the time of turning on the power supply relay 40, is reduced to be sufficiently small.

Since the capacitor 42 is pre-charged by the turn-on of the ignition switch 50, it is difficult to diagnose whether the power supply relay 40 has fixed-closure abnormality with respect to some charge voltages of the capacitor 42 produced before the power supply relay 40 is turned on. Therefore, the fixed-closure abnormality of the power supply relay 40 is detected by monitoring or checking whether the charge voltage of the capacitor 42 drops by turning off the power supply relay 40 to the open state after the ignition switch 50 is turned off to the open state by a driver.

Figure 2:
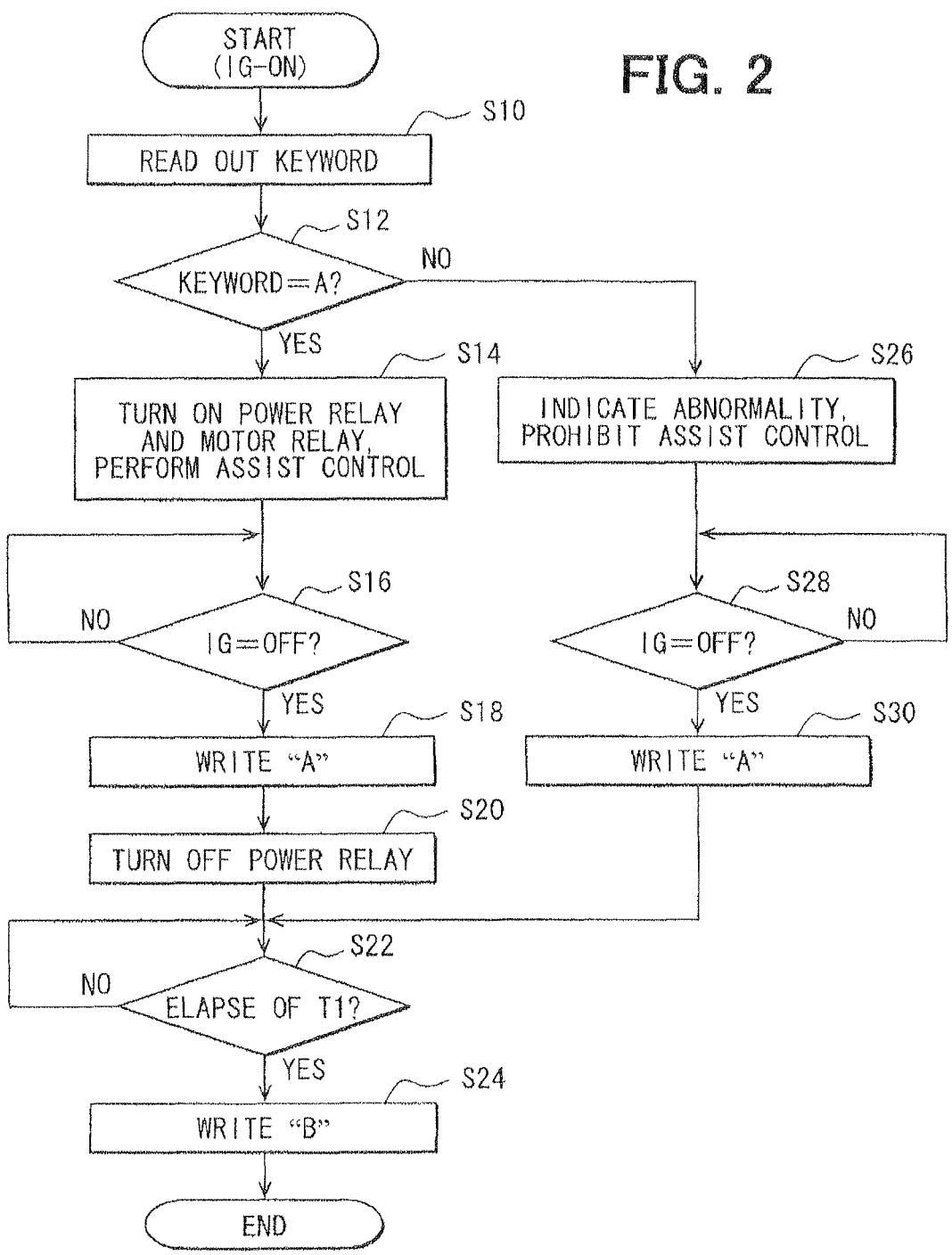
FIG. 2 is a flowchart showing processing of diagnosing fixed-closure abnormality of a power supply relay in the first embodiment.

This fixed-closure malfunction diagnosis processing is executed by the microcomputer 30 as shown in FIG. 2 in response to the turn-on of the ignition switch 50 as a trigger. The microcomputer 30 thus operates as a diagnosis circuit as well as a motor control circuit.

First at step S10, a keyword stored in a predetermined address of the non-volatile memory 32 is read out. The keyword is provided to indicate a result of diagnosis (presence or absence) of the fixed-closure abnormality. The keyword is initially set to "A," which is predetermined to indicate "normal (no abnormality)." At step S12, it is checked whether the keyword is "A" indicating no abnormality. If the keyword is "A," the switching elements 60 and 62 are turned on at step S14 to thereby turn on the power supply relay 40 and the motor relay 46 to the closed state. The drive amount of the motor 10 is also controlled so that the steering operation by a driver is assisted by the motor 10.

This step S14 is repeated until it is determined at step S16 that the ignition switch 50 is turned off to the open state. After the ignition switch 50 is turned off (S16: YES), the keyword "A" is written in the predetermined address of the memory 32. At step S20, the power supply relay 40 is turned off to the open state. Specifically, by turning off the switching element 60, the current flowing in the excitation coil of the power supply relay 40 is interrupted. Since the magnetic flux generated by the current flowing in the excitation coil is reduce to zero, the power supply relay 40 is turned off to the open state, in which the movable contact is disconnected from the fixed contact in the power relay 40.

After the power supply relay 40 is turned off to the open state, a charge path from the battery 12 to the capacitor 42 is interrupted, the charge voltage of the capacitor 42 decreases by discharging through the discharge resistor 44 and power consumption of the microcomputer 30. It is noted that the microcomputer 30 is maintained operative with the charged power of the capacitor 42 even after the ignition switch 50 and the power supply relay 40 are turned off. The capacitor 42 is discharged to a lowest limit voltage (for example, 5V) required for the microcomputer 30 to operate in about a certain time after the power supply relay 40 is turned off. At step S22, it is checked whether a predetermined time T1 has elapsed after the power supply relay 40 is turned off. This time T1 is set to correspond to a possible minimum of the certain time or more to check whether the charge voltage of the capacitor 42 drops in the predetermined time T1. If the time T1 has elapsed (S22: YES), the keyword is changed at S24 to "B" thereby indicating that the power supply relay 40 has fixed-closure abnormality, in which the movable contact is continuously connected to and not disconnected from the fixed contact in the power supply relay 40. In the case that the power supply relay 40 has no fixed-closure abnormality, the microcomputer 30 becomes inoperative before step S24 is executed, that is, before the elapse of time T1, and the keyword is not changed to "B."

If it is determined that the keyword is not "A" (S12: NO), it indicates that step S24 has been executed and the keyword has changed to "B," which indicates that the power supply relay 40 has the fixed-closure abnormality. At step S26, the fixed-closure abnormality is indicated to an outside. For example, this abnormality is indicated by turning on a malfunction indicator light (MIL) 34. In addition, the assist control is prohibited. As a result, the motor relay 46 is not turned on to the closed state and hence the motor 10 is not driven because of no supply of power from the battery 46.

After step S26, it is checked at step S28 whether the ignition switch 50 is turned off by a driver. If the ignition switch 50 is turned off (S28: YES), the keyword "A" is written in the non-volatile memory 32 in place of the keyword "B" at step S30. Steps S22 and S24 follow step S30.

After step S24, the sequence of processing is ended.

The operation of diagnosing the fixed-closure is shown in FIG. 3. In FIG. 3, (a) indicates a change of the ignition switch 50, (b) indicates a change of the output voltage VIG corresponding to the battery voltage (anode-side voltage of the diode 52) of the ignition switch, (c) indicates a change of the charge voltage VPC of the capacitor 42, (d) indicates change of the keyword, (e) indicates a change of the power supply relay 40, (f) indicates a change of a check result of the fixed-closure abnormality, and (g) indicates a change of the malfunction indicator light 34.

As shown in FIG. 3, when the ignition switch 50 is turned on by a user at time t1, the output voltage VIG of the ignition switch 50 and the capacitor 42 starts to be charged to provide the voltage VPC. Then, when the keyword is referred to and confirmed to be "A," the microcomputer 30 turns on the switching element 60 and maintains the turn-on of the power supply relay 40 at time t2. As a result, the current path between the battery 12 and the capacitor 42 is closed. Even after the ignition switch 50 is turned off at time t3, the microcomputer 30 maintains the switching element 60 in the turned-on condition to maintain the power supply relay 40 in the turned-on condition, so that the capacitor 42 maintains its charge voltage VPC. The microcomputer 30 maintains this condition until it completes the required various post-processing, for example, writing the keyword "A." At time t4, at which the post-processing is completed, the microcomputer 30 turns off the switching element 60. As long as the power supply relay 40 has no abnormality, it is turned off to open the current path between the battery and the capacitor 42.

However, if the power supply relay 40 has the fixed-closure abnormality, the power supply relay 40 cannot turn off to open the current path. As a result, the capacitor 42 is persistently connected to the battery 12. The charge voltage VPC therefore does not drop after time t4. If this condition continues to be more than the predetermined time T1, the microcomputer 30 changes the keyword and writes "B" in place of "A" at time t5.

When the ignition switch 50 is turned on again at time t6, the microcomputer 30 refers to the keyword stored in the non-volatile memory 32. Since the stored keyword is "B," the microcomputer 30 determines that the power supply relay 40 has the fixed-closure abnormality and turns on the malfunction indicator light 54 at time t7. When the ignition switch 50 is turned off at time t8 again, the microcomputer 30 changes the keyword to "A."

If the power supply relay 40 does not have the fixed-closure abnormality any more, the capacitor 42 is allowed to discharge through the resistor 44. The charge voltage VPC falls and becomes less than the predetermined threshold level Vth. As a result, when the ignition switch 50 is turned on next time, the power supply relay 40 is determined to be normal and the assist control is performed.

The first embodiment provides the following advantages.

(1) The power supply relay 40 is diagnosed whether it has the fixed-closure abnormality, based on the charge voltage of the capacitor 42 after both of the ignition switch 50 and the power supply relay 40 are turned off to the open state. Thus, the fixed-closure abnormality can be detected.

(2) The operability of the microcomputer 30 is stored as data of the keyword, if the microcomputer 30 remains operable after the elapse of the predetermined time T1 from the turn-off of both of the ignition switch 50 and the power supply relay 40 to the open state. By referring to the value of the keyword when the ignition switch 50 is turned on, the power supply relay 40 is diagnosed whether it has the fixed-closure abnormality. If the fixed-closure abnormality of the power supply relay 40 is confirmed when the ignition switch 50 is turned on, a driver can be notified of the abnormality appropriately.

(3) The capacitor 42 is charged by the battery 12 through the pre-charge resistor 56, the resistance of which is smaller than that of the discharge resistor 44. The capacitor 42 can therefore be charged to increase its charge voltage closely to the voltage of the battery 12 before the power supply relay 40 is turned on to connect the capacitor 42 and the battery 12 therethrough.

(4) The discharge resistor 44 is connected in parallel to the capacitor 42. The speed of drop of the charge voltage of the capacitor 42 caused when the ignition switch 50 and the power supply relay 40 are turned off can be increased. As a result, the predetermined time T1 can be set to be short. Even if the ignition switch 50 is turned on again in a short time, the fixed-closure of the power supply relay 40 can be diagnosed readily.

Second Embodiment

A second embodiment is described next with respect to parts different from the first embodiment.

In the second embodiment, the power supply relay 40 is further diagnosed with respect to its fixed-open abnormality, in which the movable contact cannot be moved to close the input terminal and the output terminal in the power supply relay 40.

Figure 4A:
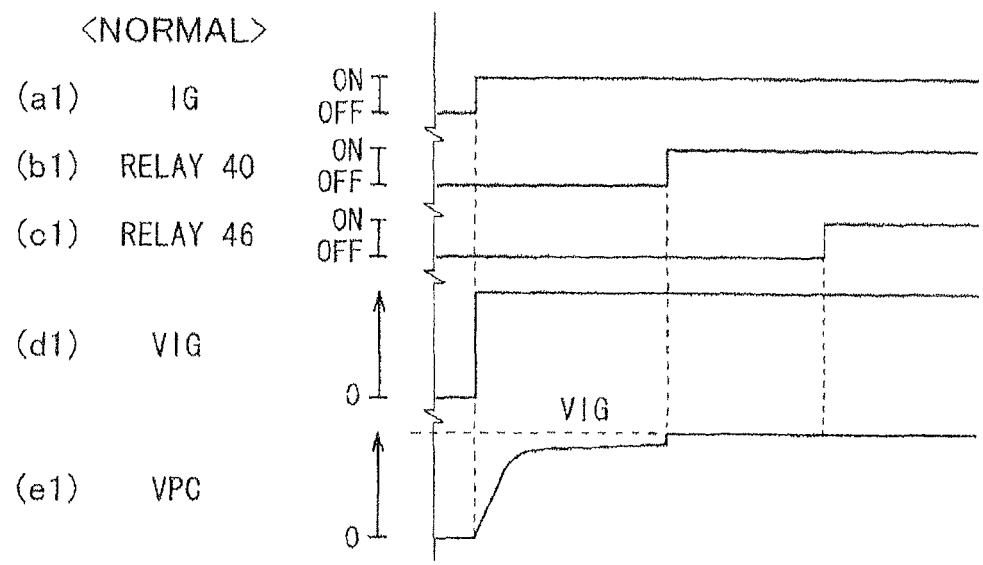
FIGS. 4A and 4B are time charts showing a principle of processing of diagnosing fixed-open abnormality of a power supply relay in a second embodiment of the present invention.
Figure 4B:
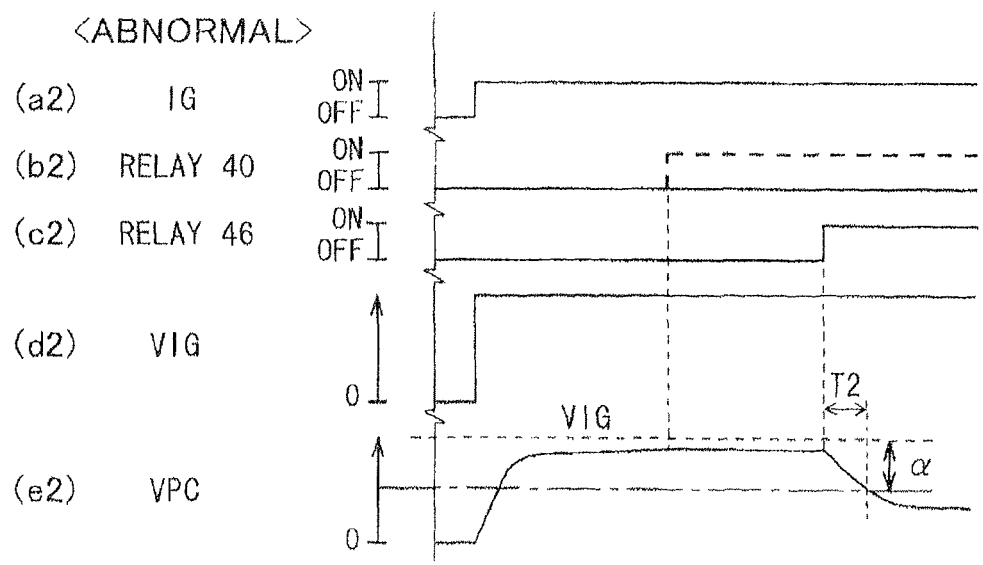

The principle of diagnosing the power supply relay 40 with respect to the fixed-open abnormality is shown in FIGS. 4A and 4B, in which the power supply relay 40 is assumed to be normal and abnormal, respectively. In FIGS. 4A and 4B, (a1) and (a2) indicate changes of the ignition switch 50, (b1) and (b2) indicate changes of the power supply relay 40, (c1) and (c2) indicate changes of the motor relay 46, (d1) and (d2) indicate changes of the output voltage VIG of the ignition switch 50, and (e1) and (e2) indicate changes of the charge voltage VPC of the capacitor 42.

If the power supply relay 40 is normal, as shown in FIG. 4A, when the ignition switch 50 is turned on, the output voltage VIG of the ignition switch 50 rises and the capacitor 42 starts to be charged. The capacitor 42 is charged to the voltage VPC, which is close to the output voltage VIG. This charge voltage VPC corresponds to a division of the voltage VIG of the battery 12 by the pre-charge resistor 56 and the discharge register 44. When the power supply relay 40 is turned on to the closed state by turning on the switching element 60, the charge voltage VPC of the capacitor 42 further rises to the output voltage of the power supply relay 40, which is substantially the same as the battery voltage. Even if the motor relay 46 is turned on to the closed state by turning on the switching element 62, the charge voltage VPC of the capacitor 42 does not change.

If the power supply relay 40 has the fixed-open abnormality, the power supply relay 40 is not turned on to the closed state because of its abnormality even when the switching element 60 is turned on. That is, the current path between the capacitor 42 and the battery 12 through the power supply relay 40 remains disconnected. The charge voltage VPC of the capacitor 42 remains to be slightly lower than the ignition output voltage VIG. Since this voltage difference is small, it is not easy to detect the fixed-open abnormality of the power supply relay 40 accurately based on this small difference. If the motor relay 46 is turned on to the closed state by turning on the switching element 62 under this condition, the charge voltage VPC of the capacitor 42 falls. This is because the resistance of the discharge path of the capacitor 42 is decreased. Specifically, the capacitor 42 is connected in parallel to not only the discharge resistor 44 but also the excitation coil of the motor relay 46 as well as the resistors 25, 26 and the motor 10. Thus the resistance of the discharge path of the capacitor 42 is reduced to be less than the resistance of the discharge resistor 44 itself. The ratio of division of the voltage VIG by the pre-charge resistor 56 and the discharge path parallel to the capacitor 42 becomes smaller than that provided by the pre-charge resistor 56 and the discharge resistor 44. Thus, the charge voltage VPC of the capacitor 42 is decreased considerably from the ignition output voltage VIG. Based on this large charge voltage drop, the fixed-open abnormality is detected.

Figure 5:
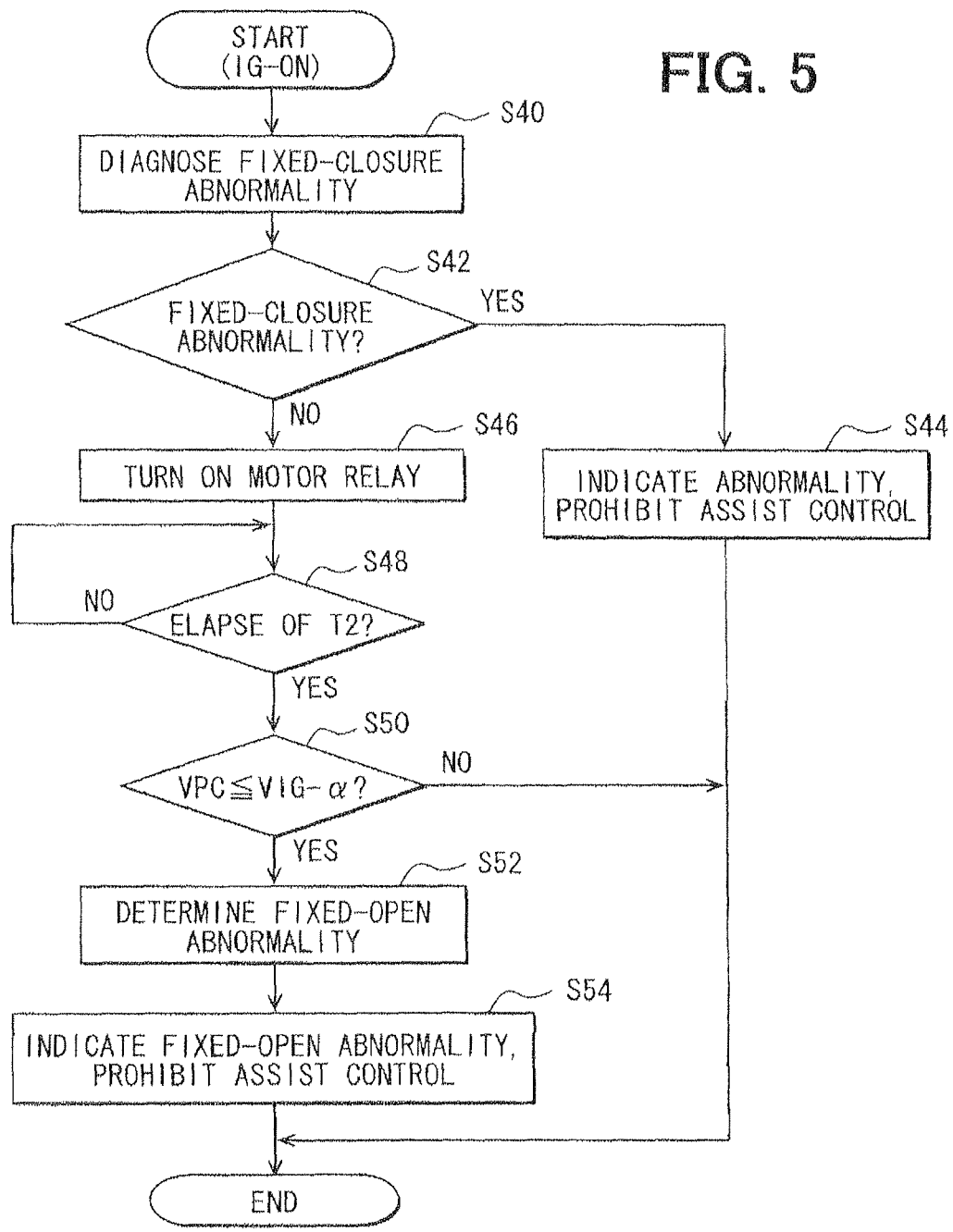
FIG. 5 is a flowchart showing the processing of diagnosing the fixed-open abnormality of the power supply relay in the second embodiment.

The fixed-open abnormality diagnosis processing is executed in the second embodiment as shown in FIG. 5. This processing is executed by the microcomputer 30 in response to the turn-on of the ignition switch 50 as a trigger.

First, at step S40, the fixed-closure abnormality of the power supply relay 40 is diagnosed by referring to the keyword stored in the non-volatile memory 32. At step S42, it is checked whether the keyword is "B," indicating the fixed-closure abnormality. If the keyword is "B" (S42: YES), the abnormality is indicated by the malfunction indicator light 34 and the assist control is prohibited.

If the keyword is not "B" (S42: NO), the motor relay 46 is turned on to the closed state by turning on the switching element 62. It is checked at step S48 whether a predetermined time T2 has elapsed after the turn-on of the motor relay 46. The predetermined time T2 is set to a shortest possible time, in which the charge voltage VPC of the capacitor 42 is supposed to fall by the amount α. After an elapse of the predetermined time T2 (S48: YES), it is checked at step S50 whether the charge voltage VPC of the capacitor 42 is less than a predetermined threshold voltage, which is less than the ignition output voltage VIG by the amount α. This step is for diagnosing the power supply relay 40 with respect to the fixed-open abnormality. The amount of drop a of the capacitor voltage is determined in accordance with the voltage VIG of the battery 12, the resistance of the pre-charge resistor 56 and the resistance of the discharge path, which includes the discharge resistor 44 and is connected in parallel to the capacitor 42. If the charge voltage VPC is less than the predetermined threshold voltage (S50: YES), it is determined at step S52 that the power supply relay 40 has the fixed-open abnormality. At step S54, the fixed-open abnormality is indicated by the malfunction indicator light 34 and the assist control is prohibited.

This processing is terminated when steps S44 or S54 has been completed or when it is determined at step S50 that the charge voltage VPC remain higher than the predetermined threshold voltage.

The second embodiment provides the following advantages in addition to the foregoing advantages of the first embodiment.

(5) The power supply relay 40 is diagnosed with respect to the fixed-open abnormality based on the charge voltage VPC of the capacitor 42 present when the ignition switch 50, the power supply relay 40 and the motor relay 46 are turned on. Even if the capacitor 42 is pre-charged, the power supply relay 40 can be diagnosed accurately with respect to the fixed-open abnormality.

(6) The power supply relay 40 is diagnosed with respect to the fixed-open abnormality based on the charge voltage VPC of the capacitor 42 and the voltage of the battery 12 (ignition output voltage VIG), when the ignition switch 50, the power supply relay 40 and the motor relay 46 are turned on. Thus, the predetermined threshold voltage for checking the fixed-open abnormality of the power supply relay 40 by comparison with the charge voltage VPC can be set by using the ignition output voltage VIG.

Third Embodiment

A third embodiment is described next with respect to parts different from the second embodiment.

Figure 6:
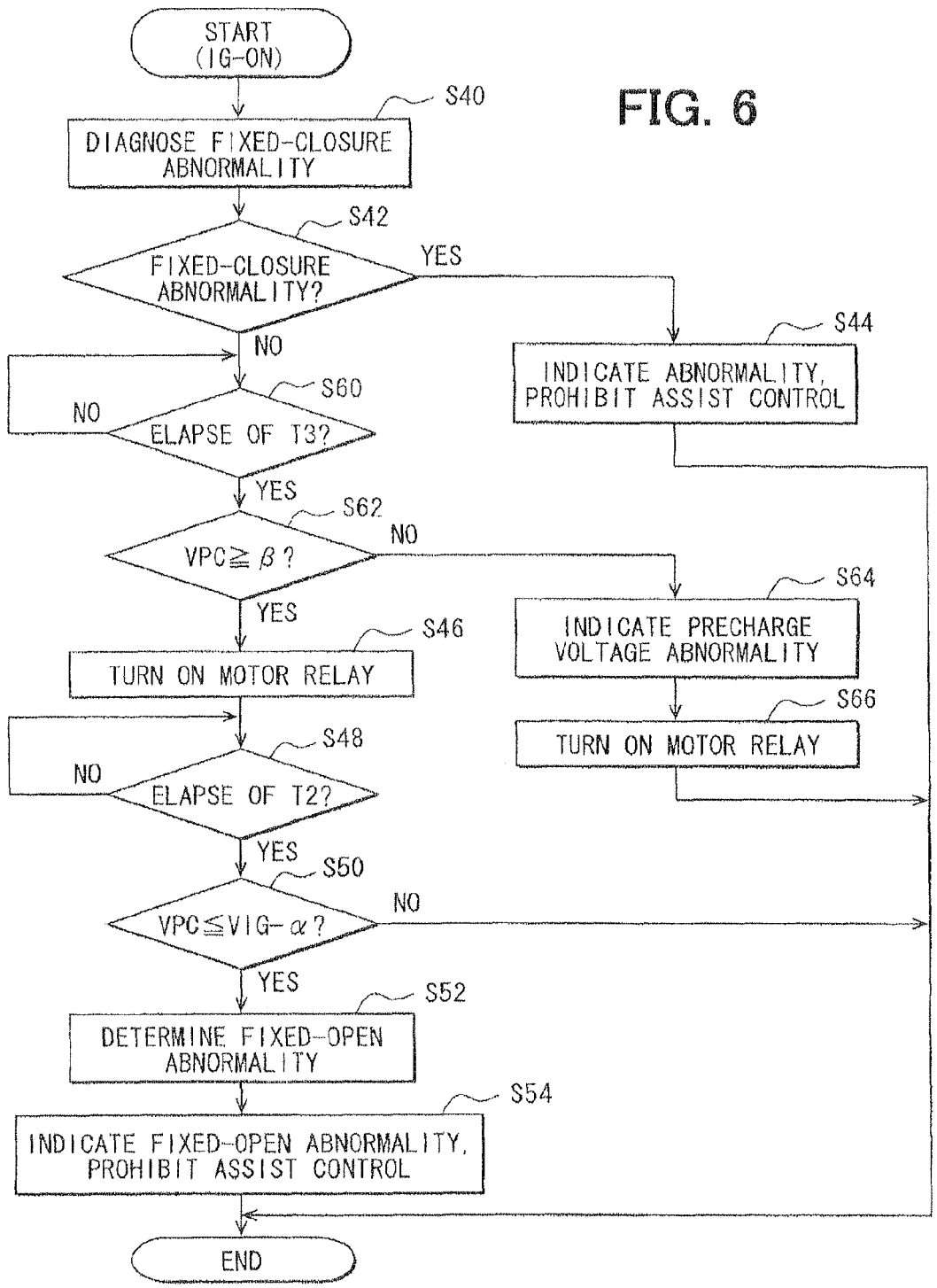
FIG. 6 is a flowchart showing processing of diagnosing fixed-open abnormality of a power supply relay in a third embodiment of the present invention.

In the third embodiment, the abnormality diagnosis processing is executed as shown in FIG. 6 in response to the turn-on of the ignition switch 50 as a trigger. In FIG. 6, steps S60, S62, S64 and S66 are executed in addition to the steps executed in the second embodiment (FIG. 5).

If it is determined at step S42 that the fixed-closure abnormality is not present (NO), it is then checked at step S60 whether a predetermined time T3 has elapsed. The predetermined time T3 is set to correspond to a period required to charge the capacitor 42 to a predetermined voltage β by the ignition voltage VIG through the pre-charge resistor 56. If the predetermined time elapses (S62: YES), it is checked at step S62 whether the charge voltage VPC is greater than the predetermined voltage β. This step S62 is for checking whether the pre-charge path including the pre-charge resistor 56 has any abnormality. Specifically, the pre-charge path is determined to be abnormal, if the charge voltage VPC does not rise sufficiently even after an elapse of time, in which the capacitor 42 is supposed to have been pre-charged sufficiently. The predetermined voltage β is therefore set to correspond to the charge voltage, which the capacitor 42 normally attains in the predetermined time T3. If the charge voltage VPC is less than the predetermined voltage 3 (S62: NO), this abnormality of low pre-charge voltage is indicated by the malfunction indicator light 34 at step S64 and the motor relay 46 is turned on to the closed state at step S66.

If the charge voltage VPC is greater than the predetermined voltage β (S62: YES), steps S46 to S54 are executed to diagnose the power supply relay 40 with respect to the fixed-open abnormality in the similar manner as in the second embodiment.

The third embodiment provides the following advantage in addition to the advantages of the first embodiment and the advantages of the second embodiment.

(7) The pre-charge path is diagnosed with respect to its abnormality based on the charge voltage VPC of the capacitor 42 produced after the ignition switch 50 is turned on. It can be therefore detected in advance, by turning on the power supply relay 40 to the closed state, that a large current will flow in the motor relay 46.

Fourth Embodiment

A fourth embodiment is described next with reference to parts different from the first embodiment.

Figure 7:
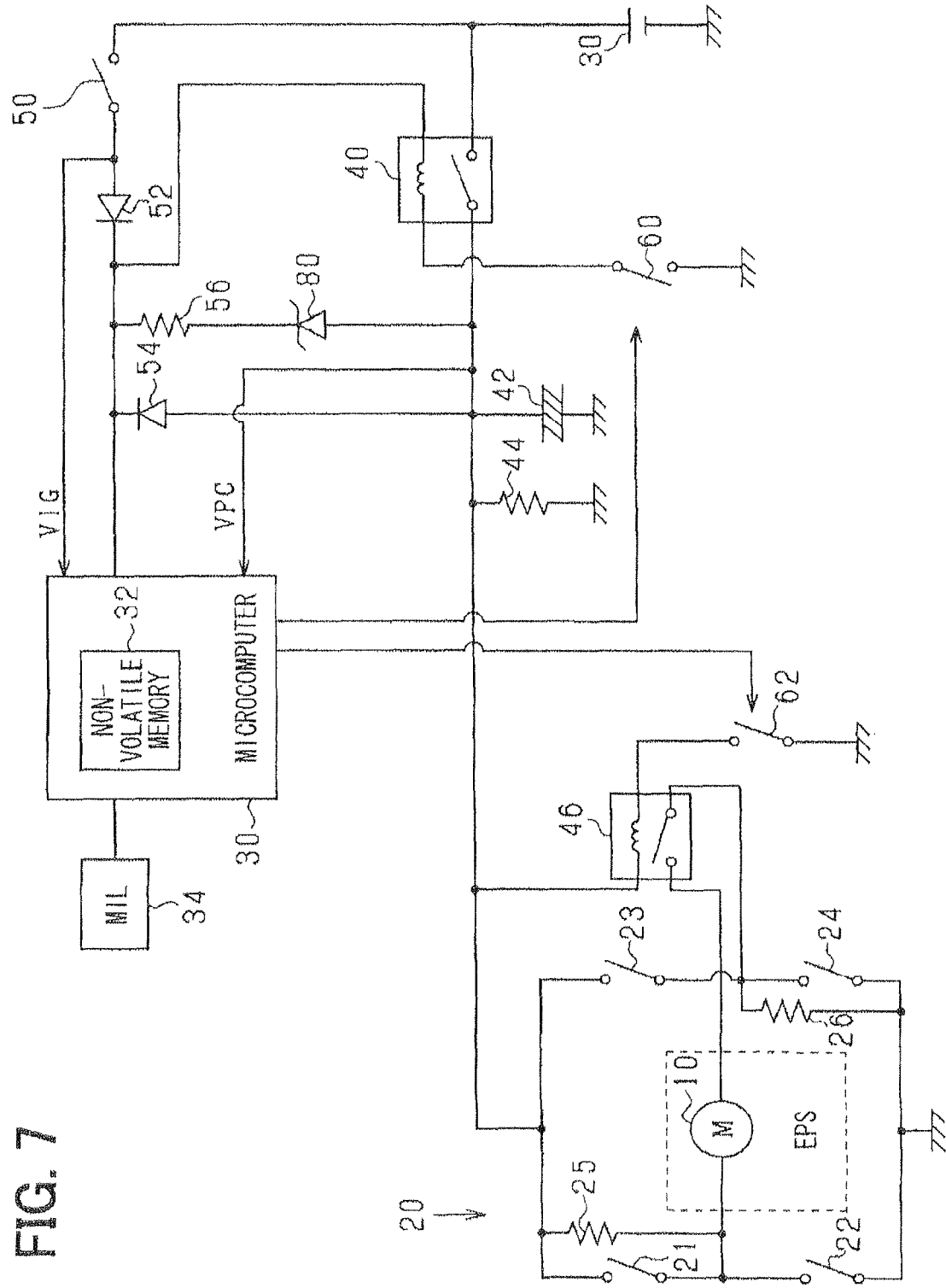
FIG. 7 is a circuit diagram showing an abnormality diagnosis system according a fourth embodiment of the present invention.

In the fourth embodiment, as shown in FIG. 7, a Zener diode 80 is connected to the pre-charge resistor 56 between two current paths, one of which is between the diode 52 and the microcomputer 30 and the other of which is between the power supply relay 40 and the H-bridge circuit 20. The breakdown voltage Vz of the Zener diode 80 is set such that the current, which flows in the power supply relay 40 when the power supply relay is turned on, does not exceed an upper limit value of an allowable current. The breakdown voltage Vz is also set such that the charge voltage VPC produced by the capacitor 42 before and after the turn-on of the power supply relay 40 may be distinguished accurately. The charge voltage VPC of the capacitor 42 is preferably greater than one half (½) of the voltage of the battery 12 and less than nine-tenth (9/10) of the same.

According to the fourth embodiment, the power supply relay can be diagnosed with respect to its fixed-closure abnormality based on the charge voltage VPC of the capacitor 42 after the ignition switch 50 is turned on and before the power supply relay 40 is turned on to the closed state.

It is possible to perform this operation by increasing the resistance of the pre-charge resistor 56 without the Zener diode 80. The increase of the resistance of the pre-charge resistor 56 will necessarily reduce the current, which flows from the battery 12 to the capacitor 42. As a result, time required to pre-charge the capacitor 42 becomes long and the start of control of the motor 10 is delayed more.

The fourth embodiment provides the following additional advantage.

(8) Since the Zener diode 80 is connected in series to the pre-charge resistor 56, the capacitor 42 can be quickly charge to a voltage, which is sufficiently lower than the charge voltage VPC attained when the power supply relay 40 is turned on to the closed state. As a result, the pre-charge can be completed quickly and the fixed-closure abnormality of the power supply relay 40 can be detected in advance of the turn-on of the power supply relay 40.

Fifth Embodiment

A fifth embodiment is described next with reference to parts different from the second embodiment (FIG. 5).

Figure 8:
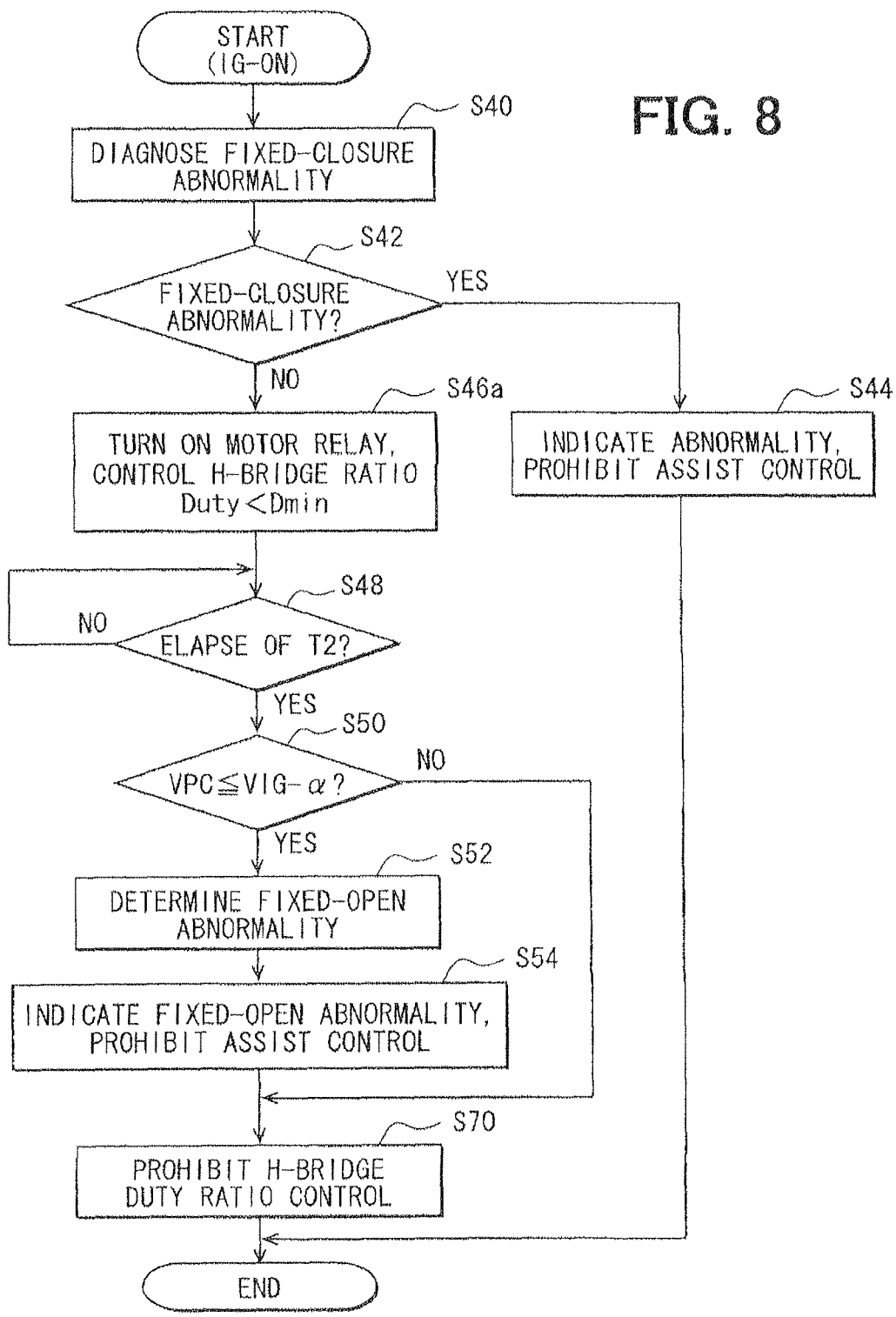
FIG. 8 is a flowchart showing processing of diagnosing fixed-open abnormality of a power supply relay in a fifth embodiment of the present invention.

In this embodiment, abnormality diagnosis processing is executed as shown in FIG. 8 by the microcomputer 30 in response to the turn-on of the ignition switch 50 as a trigger. In the fifth embodiment shown in FIG. 8, steps S46a and S70 are additionally executed relative to the processing of the second embodiment shown in FIG. 5. Step S46a is a replacement of step S46.

Specifically, if the power supply relay 40 has no fixed-closure abnormality (S42: NO), the motor relay 46 is turned on to the closed state and the duty ratio Duty of the H-bridge circuit 20 is controlled to be less than a minimum duty ratio Dmin at step S46a. The minimum duty ratio Dmin is a minimum value of the duty control for the motor 10 by the H-bridge circuit 20 at the time the motor 10 is driven. When the switching elements 21 and 24 are turned on, the current path formed of the switching elements 21, 24 and the motor 10 is added in parallel to the discharge resistor 44. When the switching elements 22 and 23 are turned on, two current paths are connected in parallel to the discharge resistor 44. One current path is formed of the switching elements 22, 23 and the motor 10, and the other current path is formed of the resistors 25, 26 and the motor 10. As a result, the resistance of the discharge paths including the discharge resistor 44 and connected in parallel to the capacitor 42 is decreased, and the charge voltage VPC of the capacitor 42 is decreased more quickly. Thus, the fixed-open abnormality can be detected at step S50 more accurately. The duty ratio is controlled within a range, in which the rotor of the motor 10 is not displaced. Thus, it is prevented that the steering wheel is moved by the motor unintentionally.

In the duty ratio control, the switching elements 21 and 24 may be turned on and off periodically at the same time, or the switching elements 22 and 23 may be turned on and off periodically at the same time. The switching elements 21, 24 and the switching elements 22, 23 may be turned on alternately. In either of the cases, the period in which the switching elements 21, 24 are turned on continuously and the period in which the switching elements 22, 23 are turned on continuously should be limited to a period not to move the rotor of the motor 10.

The duty ratio control is stopped at S70, if the main relay 40 has no fixed-open abnormality (S50: NO) or the assist control is prohibited (S54).

The fifth embodiment provides the following advantage in addition to the advantages of the second embodiment.

(9) Since the H-bridge circuit 20 is duty-controlled in diagnosing the power supply relay 40 with respect to the fixed-open abnormality, the diagnosis operation can be performed more accurately.

Other Embodiments

The foregoing embodiments may be modified as follows.

The fourth embodiment may be modified similarly as the second embodiment is modified by the third embodiment.

The third embodiment may be modified similarly as the second embodiment is modified by the fifth embodiment.

The fixed-closure diagnosis performed in the first embodiment need not be based on the drop of the charge voltage VPC produced after both of the ignition switch 50 and the power supply relay 40 are turned on to the closed state. For example, this diagnosis may be performed based on the drop condition of the voltage during a period in which a voltage greater than the low limit value of the operation voltage of the microcomputer 30 after both of the ignition switch 50 and the power supply relay 40 are turned on to the closed state.

In the second and the third embodiments, the microcomputer need not have input terminals provided exclusively to monitor the ignition output voltage VIG and the charge voltage VPC to detect the fixed-open abnormality. The fixed-open abnormality may be detected based on only the charge voltage VPC. In this case, when the motor relay 46 is turned on after the ignition switch 50 and the power supply relay 40 are turned on, the charge voltage VPC does not fall if the power supply relay 40 has no fixed-open abnormality. However, the charge voltage falls if the power supply relay 40 has the fixed-open abnormality. Therefore it is possible to diagnose the power supply relay 40 with respect to the fixed-open abnormality based on whether the charge voltage VPC falls more than a predetermined amount after the motor relay 46 is turned on to the closed state.

In each embodiment, the keyword need not be written and stored in the non-volatile memory 32 for the fixed-closure diagnosis. For example, the keyword may be written and stored in a back-up RAM, which is maintained operable irrespective of a condition of the ignition switch 50, that is, a condition of connection between the microcomputer 30 and the battery 12. The keyword may be written and stored in a volatile memory. Even in this case, the keyword "B" indicating the fixed-closure abnormality can be maintained, because the power supply to the microcomputer 30 is maintained by the power supply relay 40. It is thus possible to perform the fixed-closure abnormality based on checking whether the keyword B is stored in the volatile memory, when the ignition switch 50 is turned on next time. The processing of writing the keyword "A" at the time the ignition switch 50 is turned off may be obviated.

In the foregoing embodiments, the power supply relay 40 may be diagnosed with respect to the fixed-closure abnormality in the conventional manner by setting the resistances of the pre-charge resistor 56 and the discharge resistor 44.

In the fourth embodiment, the abnormality diagnosis performed in the other embodiments may be performed.

In the foregoing embodiments, the discharge resistor 44 may be obviated. Even in this case, the current path for charging the capacitor 42 is interrupted by turning off the power supply relay 40 to the open state under the condition that the ignition switch 50 is in the turned-off condition. The voltage of the capacitor 42 thus falls as the power of the capacitor 42 is consumed by the microcomputer 30. As a result, the power supply relay 40 is diagnosed with respect to the fixed-closure abnormality based on the charge voltage VPC of the capacitor 42 in the similar manner as in the foregoing embodiments.

The motor 10 is not limited to the brush-type DC motor but may be a brushless-type DC motor. In this case, a three-phase inverter may be used as the power conversion circuit.

The motor 10 is not limited to be used in the electric power-assisting apparatus but may be used in a gear ratio varying apparatus, which is provided between an input shaft mechanically coupled to a steering wheel and an output shaft driven to rotate by an electric motor and varies a ratio of rotation amount of the output shaft relative to a rotation amount of the input shaft. The motor 10 may be used in a steering system of a steer-by-wire system. In these cases, it becomes possible in the fifth embodiment that the duty ratio may be set to a value, which will cause a small amount of movement of the rotor of the motor 10 without any turning the steering wheel. The motor 10 may also be used to drive an air compressor or a motive power generator mounted in a vehicle.

What is claimed is:

1. An abnormality diagnosis method for a system, comprising:
    controlling by a microcomputer, connected to a power supply relay provided to open and close a current path formed between an electric power source and a power conversion circuit, a capacitor connected between a reference potential and the current path formed between the power conversion circuit and the power supply relay, a resistor connected in parallel to the capacitor to provide a discharging path of the capacitor, and a switch operable manually and provided to open and close a pre-charge path formed between the power source and the capacitor to pre-charge the capacitor by the power source, the pre-charge path bypassing the power supply relay,
    so that the microcomputer, including a memory which stores a code indicating a diagnosis result of the power supply relay, controls the power supply relay and diagnoses the power supply relay with respect to fixed-closure abnormality of the power supply relay, wherein the microcomputer is configured to:
    check whether the code stored in the memory is other than a predetermined code, which indicates the fixed-closure abnormality of the power supply relay, when the switch is closed to supply power from the electric power source to the computer and pre-charge the capacitor,
    control the power supply relay to close the current path, when the code is other than the predetermined code, thereby to supply the current from the electric power source through the current path to the power conversion circuit;
    control the power supply relay to open the current path, when the switch is opened, thereby to stop power supply through the power supply path and cause the capacitor to discharge through the resistor;
    write the code stored in the memory to be other than the predetermined code, when the switch is opened; and
    change the code stored in the memory to the predetermined code, when the capacitor continues to maintain a charge voltage sufficient for an operation of the computer after a predetermined period from when the power supply relay is controlled to open the current path.

2. The abnormality diagnosis method for a system according to claim 1, wherein
    a motor relay is provided between the power conversion circuit and a motor to open and close a current path from the power conversion circuit to the motor, and wherein
    the microcomputer is configured to diagnose the power supply relay with respect to fixed-open abnormality based on the charge voltage of the capacitor produced when the switch is closed, and the power supply relay and the motor relay are controlled to close, the fixed-open abnormality indicating that the power supply relay maintains an open state even if controlled to close.

3. The abnormality diagnosis method for a system according to claim 2, wherein
    the microcomputer is configured to diagnose the power supply relay based on a voltage of the power source in addition to the charge voltage of the capacitor.

4. The abnormality diagnosis method for a system according to claim 2, wherein
    a switching element is provided to open and close a current path formed of the power conversion circuit and the motor in parallel to the capacitor, and wherein
    the microcomputer is configured to diagnose the power supply relay with respect to the fixed-open abnormality based on the charge voltage of the capacitor produced when the switching element is controlled to open and close the current path.

5. The abnormality diagnosis method for a system according to claim 1, wherein
    the microcomputer is configured to diagnose the pre-charge path based on the charge voltage of the capacitor produced when the switch is in a closed state and the power supply relay is in an open state.

6. The abnormality diagnosis method for a system according to claim 1, wherein
    the pre-charge path includes a pre-charge resistor connected between the switch and the capacitor for pre-charging the capacitor therethrough.

7. An abnormality diagnosis method for a system comprising:
    controlling by a microcomputer, connected to a power supply relay provided to open and close a current path formed between an electric power source and a power conversion circuit, a capacitor connected between a reference potential and the current path formed between the power conversion circuit and the power supply relay, a switch operable manually and provided to open and close a pre-charge path formed between the power source and the capacitor to pre-charge the capacitor by the power source, the pre-charge path bypassing the power supply relay, and a motor relay provided between the power conversion circuit and a motor to open and close a current path from the power conversion circuit to the motor,
    so that the microcomputer controls the power supply relay and the motor relay and diagnoses the power supply relay with respect to fixed-open abnormality based on a charge voltage of the capacitor produced when the switch is closed, and the power supply relay and the motor relay are controlled to close, the fixed-open abnormality indicating that the power supply relay maintains an open state even if controlled to close, wherein the microcomputer is configured to
    control the power supply relay and the motor relay to close, when the switch is closed, thereby to supply the current to the motor through the current path and the motor relay, compare the charge voltage of the capacitor, which is produced after a predetermined time from when the power supply relay is controlled to close the current path, with a predetermined voltage, which is smaller than a voltage of the power supply source, and determine the fixed-open abnormality of the power supply relay, when the charge voltage of the capacitor produced after the predetermined time is smaller than the predetermined voltage.

8. The abnormality diagnosis method for a system according to claim 7, wherein the power conversion circuit comprises an H-bridge circuit.

9. The abnormality diagnosis method for a system according to claim 7, wherein a switching element is provided to open and close a current path formed of the power conversion circuit and the motor in parallel to the capacitor, and wherein the microcomputer is configured to diagnose the power supply relay with respect to the fixed-open abnormality based on the charge voltage of the capacitor produced when the switching element is controlled to open and close the current path.

10. The abnormality diagnosis method for a system according to claim 7, wherein the microcomputer is configured to diagnose the pre-charge path based on the charge voltage of the capacitor produced when the switch is in a closed state and the power supply relay is in the open state.

11. The abnormality diagnosis method for a system according to claim 7, wherein the pre-charge path includes a pre-charge resistor connected between the switch and the capacitor for pre-charging the capacitor therethrough.

12. The abnormality diagnosis method for a system according to claim 7, wherein a discharge resistor connected to the capacitor in parallel for discharging the capacitor therethrough.

* * * * *